(12) United States Patent
Yune et al.

(10) Patent No.: US 8,242,583 B2
(45) Date of Patent: Aug. 14, 2012

(54) SEMICONDUCTOR DEVICE HAVING CMP DUMMY PATTERN

(75) Inventors: Hyoung Soon Yune, Seoul (KR); Yeong Bae Ahn, Cheongju-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 237 days.

(21) Appl. No.: 12/493,080

(22) Filed: Jun. 26, 2009

(65) Prior Publication Data
US 2010/0155904 A1    Jun. 24, 2010

(30) Foreign Application Priority Data
Dec. 19, 2008  (KR) .......................... 10-2008-0130106

(51) Int. Cl.
*H01L 29/06* (2006.01)
*H01L 21/44* (2006.01)

(52) U.S. Cl. ................ 257/622; 257/E21.553; 438/666

(58) Field of Classification Search .................. None
See application file for complete search history.

(56) References Cited

U.S. PATENT DOCUMENTS

| 7,514,736 B2 * | 4/2009 | Hong et al. ................... 257/296 |
| 2001/0040242 A1 * | 11/2001 | Koike ............................. 257/170 |
| 2005/0233564 A1 | 10/2005 | Kitada et al. |
| 2009/0317749 A1 * | 12/2009 | Lee ................................. 430/319 |
| 2010/0327467 A1 * | 12/2010 | Hirabayashi .................. 257/786 |

FOREIGN PATENT DOCUMENTS

| JP | 2004-012722 A | 1/2004 |
| KR | 1020020046469 A | 6/2002 |
| KR | 1020030058679 A | 7/2003 |

* cited by examiner

*Primary Examiner* — Alonzo Chambliss

(57) ABSTRACT

A semiconductor device including a CMP dummy pattern and a method for manufacturing the same are provided. The warpage of a wafer can be prevented by forming the CMP dummy pattern in the same direction and/or at the same angle as a pattern of a cell region. Accordingly, overlay error caused by etching residues is reduced, thereby improving the yield of the semiconductor device.

15 Claims, 6 Drawing Sheets

SEMICONDUCTOR DEVICE HAVING CMP DUMMY PATTERN

CROSS-REFERENCE TO RELATED APPLICATION

The priority of Korean patent application No. 10-2008-0130106 filed on Dec. 19, 2008, the disclosure of which is hereby incorporated in its entirety by reference, is claimed.

BACKGROUND OF THE INVENTION

The present invention relates to a semiconductor device having pattern regions requiring a polishing process and a method for manufacturing the same.

Recently, the needs for high capacity semiconductor memory devices have grown. This is especially true for dynamic random access memory (DRAM). However, due to the limitation in increasing a chip size, an increase in DRAM capacity also reaches a limitation. The increase of a chip size reduces the number of chips per wafer, which causes a reduction in the productivity of devices. Therefore, many efforts have been made to reduce a cell area by modifying a cell layout and integrate more memory cells into a single wafer. Due to such efforts, the cell structure is changing from an $8F^2$ layout to a $6F^2$ layout.

Also, as semiconductor fabrication technologies have been developed, planarization technologies have also been advanced. In the conventional art, a traditional borophosphosilicate glass (BPSG) reflow has been used to planarize an interlayer dielectric film. In recent years, however, improvement in the degree of planarization has been achieved by applying a chemical mechanical polishing (CMP) process.

The application of a CMP process has improved the degree of planarization to some extent, but has limitations in obtaining uniform heights inside a chip.

That is, due to the different pattern density in a cell region and a core/peripheral circuit region, the degree of polishing at an insulating film differs from the cell region to the core/peripheral circuit region. This causes a dishing phenomenon where an upper portion of the core/peripheral region is recessed.

FIGS. 1a to 1c are cross-sectional views illustrating a general method for manufacturing a semiconductor device including a CMP dummy pattern.

Referring to FIG. 1a, a cell region and a core/peripheral circuit region defined in a substrate 10 have a very different pattern density. As illustrated in FIG. 1b, if a CMP process is performed on an insulating film 20 deposited over the substrate 10, a dishing phenomenon occurs. This is caused by a wide interval between patterns in the core/peripheral circuit region, resulting in a dish shaped recess.

If a layer is deposited over the dished insulating film in a subsequent process, an optical focus mismatch can occur due to the height difference caused by the dishing, which results in pattern failure.

To prevent the dishing phenomenon, a wafer open control dummy pattern, as a CMP dummy pattern, is formed in the core/peripheral circuit region. That is, as illustrated in FIG. 1c, the dishing phenomenon could be overcome because the interval between patterns is substantially reduced by forming a wafer open control dummy pattern 15 in an unused empty space of the core/peripheral circuit region.

As such, since the CMP process is sensitive to the pattern density, it is important to design the semiconductor device to maintain uniform pattern density inside the chip in a design step.

However, in the case of a semiconductor device having a $6F^2$ layout, ISO patterns formed in the cell region are arranged obliquely in a diagonal direction, whereas isolation (ISO) patterns formed in the core/peripheral circuit region are arranged vertically with respect to a word line in the same manner as the $8F^2$ layout. Thus, as can be seen from the measurement result of FIG. 2, the warpage of the wafer after the ISO process becomes different according to the position of the wafer. If the warpage of the wafer is not uniform, a misalignment may be caused by etching residues when cell patterns are formed after the ISO process. Particularly, in forming a flash memory floating gate (FG), the etching residues may cause a greater problem.

To solve these shortcomings, if a pattern of the core/peripheral circuit region and a pattern of the cell region are formed similar to each other, the warpage of the wafer may be improved to some extent. However, in the actual design step, it is difficult to modify the pattern of the core/peripheral circuit region to be equal to the pattern of the cell region.

BRIEF SUMMARY OF THE INVENTION

According to an embodiment of the present invention, a semiconductor device includes: a cell region including a first pattern inclined at a predetermined angle; and a core/peripheral circuit region including a second pattern with a lower density than the cell region, and a dummy pattern inclined in the same direction or at the same angle as the first pattern.

The dummy pattern may include a CMP dummy pattern arranged in a wafer open control dummy pattern region.

The dummy pattern may include at least one open region inclined at a predetermined angle within a rectangular pattern inclined at the same angle as the open region, or may include a plurality of unit patterns that are integrally formed in parallel at the same height, the unit patterns each having an open region inclined at a predetermined angle and being inclined at substantially the same angle as the open region.

The open region of the dummy pattern may have a height-to-width ratio of approximately 5:1.

The first pattern and the second pattern may include an ISO pattern, and the dummy pattern may be inclined at substantially the same angle as the first pattern.

According to another embodiment of the present invention, a method for manufacturing a semiconductor device having a CMP dummy pattern includes: forming an insulating film over a substrate defining a cell region and a core/peripheral circuit region; and etching the insulating film and the substrate to form a first pattern in the cell region and form a second pattern and a dummy pattern in the core/peripheral circuit region, wherein the first pattern is inclined at a predetermined angle, and the dummy pattern is formed in the same direction as the first pattern.

The dummy pattern may be formed in a wafer open control dummy pattern region, and may be inclined at the same angle as the first pattern.

The etching-the-insulating-film-and-the-substrate may be performed by a shallow trench isolation (STI) etch process.

DESCRIPTION OF EMBODIMENTS

Figure 1A:
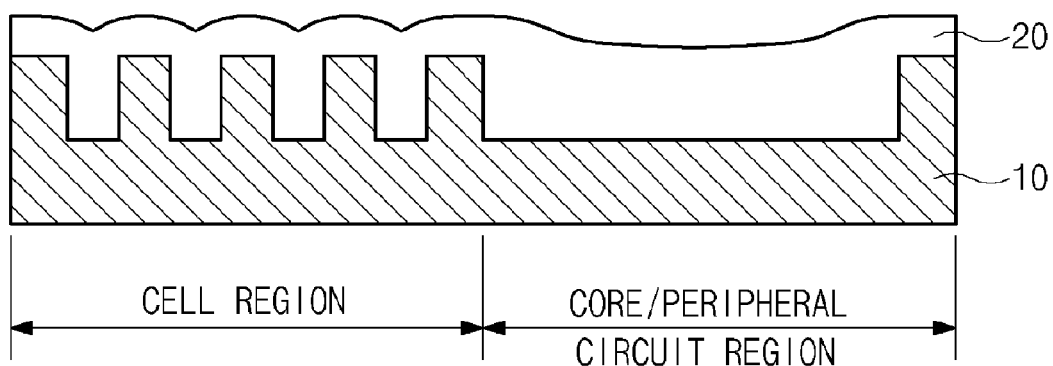
FIGS. 1a to 1c are cross-sectional diagrams illustrating a general method for manufacturing a semiconductor device including a CMP dummy pattern.
Figure 1B:
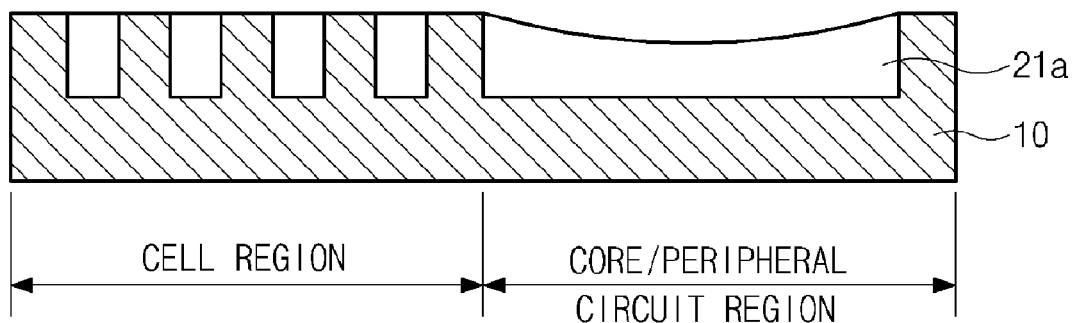
Figure 1C:
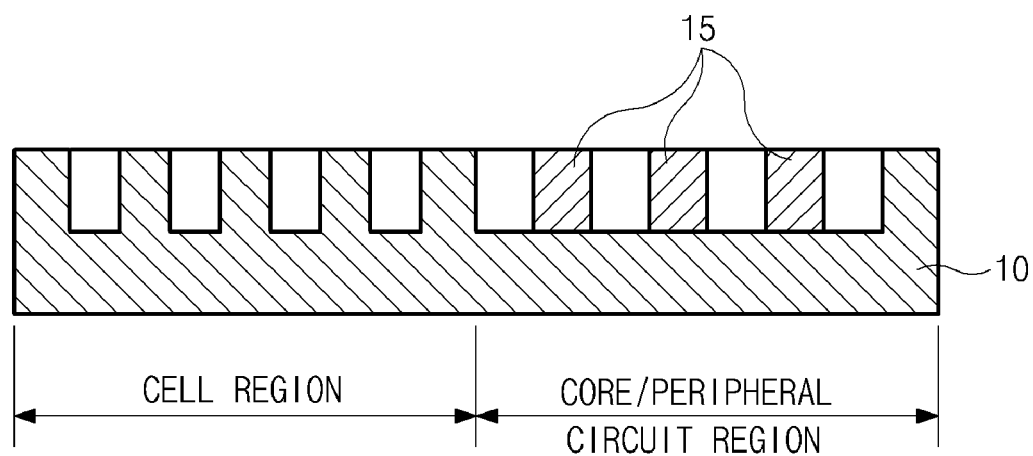
Figure 2:
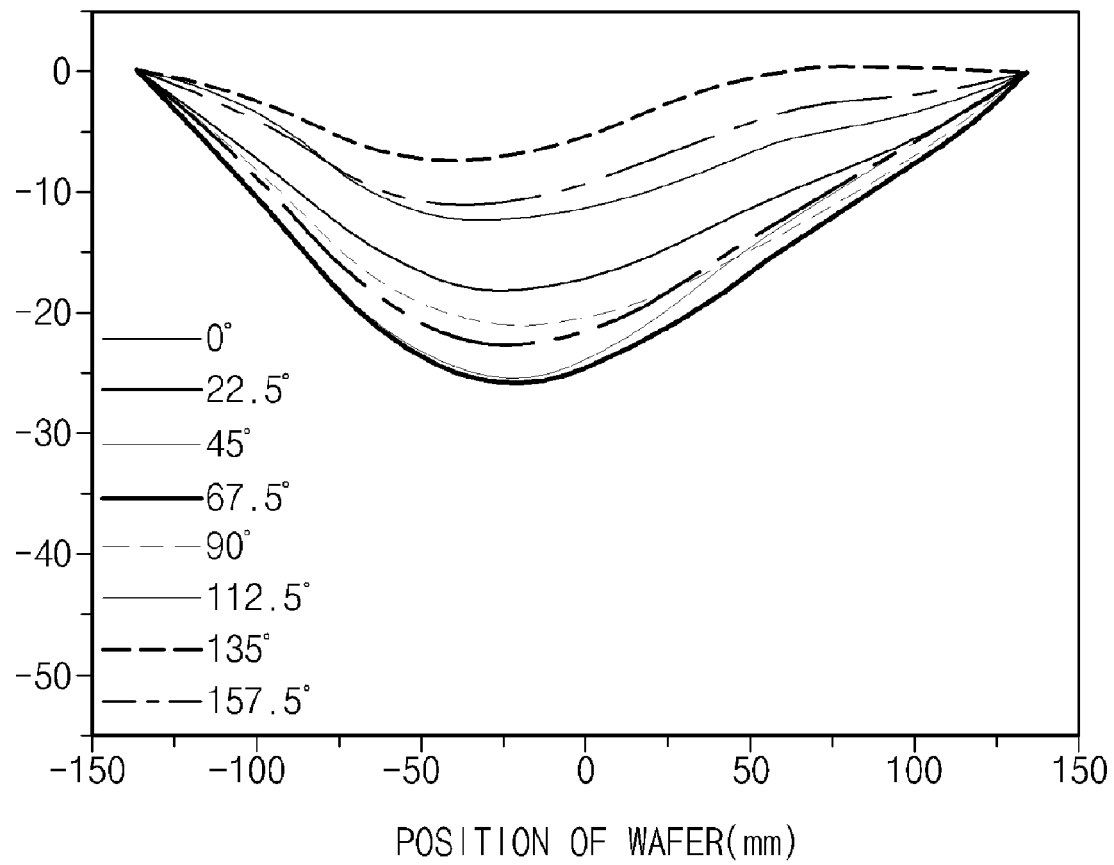
FIG. 2 is a graph showing the measurement result of warpage according to a position of a wafer after an ISO process when a pattern of a cell region and a pattern of a core/peripheral circuit region are formed in different directions.
Figure 3:
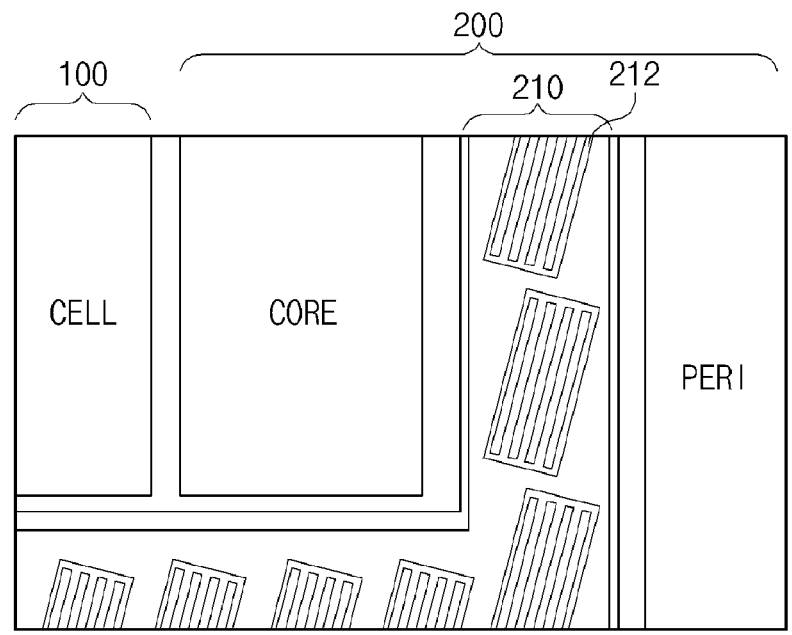
FIG. 3 is a plan view illustrating a layout of a semiconductor device having a CMP dummy pattern according to an embodiment of the present invention.

FIG. 3 is a plan view illustrating a layout of a semiconductor device having a CMP dummy pattern according to an embodiment of the present invention.

A semiconductor device is formed with a cell region 100 and a core/peripheral circuit region (hereinafter "circuit region") 200. In a cell region 100, a density of patterns (e.g., ISO patterns or ISO structures) is high. However, in circuit region 200, a density of patterns is low and patterns have a larger width than those of the cell region 100. For convenience of explanation, a cell region 100 and a circuit region 200 in a semiconductor device having a 6F² layout are partially illustrated in FIG. 3.

ISO patterns formed in the cell region 100 of the semiconductor device having a 6F² layout are inclined at an angle (for example, 26.5 degrees or 116.5 degrees) in an arbitrary direction, whereas ISO patterns formed in a cell region of a semiconductor device having an 8F² layout are arranged in a vertical direction. However, ISO patterns (design patterns and dummy patterns) formed in the core/peripheral circuit region 200 of the semiconductor device having a 6F² layout are arranged in a vertical direction in the same manner as the semiconductor device having an 8F² layout.

That is, the ISO patterns formed in the cell region 100 and the ISO patterns formed in the core/peripheral circuit region 200 are arranged not in the same direction but in the different direction. Hence, the warpage of a wafer after the ISO process becomes different according to a position of the wafer. However, in the actual design step, it is difficult to form the ISO patterns obliquely in the circuit region 200, just like those of the cell region 100.

Therefore, according to an embodiment of the present invention, a wafer open control dummy pattern inclined in the same direction and/or at the same angle as the ISO patterns of the cell region 100 is formed in a secondary region 210 of the circuit region 200. The secondary region 210 occupies an open area which has no relation to an operation of a core/peripheral circuit in the present embodiment. The secondary region 210 is provided between the core circuit region and the peripheral circuit region in the present embodiment, but may be placed in a different position in another embodiment, e.g., at an outer side of the peripheral circuit region.

Since various transistors having various functions are formed in the circuit region 200, the ISO patterns of the circuit region 200 are not formed uniformly, as opposed to those of the cell region 100. Thus, the secondary region (or a wafer open control dummy pattern region) 210 of significant space having no active region of design patterns may be provided in the circuit region 200. In the typical semiconductor device, the cell region 100, the CORE and PERI of the circuit region 200, and the secondary region 210 occupy approximately 42.8%, approximately 17.9%, and approximately 9.7% of the entire chip area, respectively. That is, the secondary region 210 occupies more than half the core/peripheral circuit region 200.

According to the embodiment of the present invention, since it is difficult to modify the patterns having relation to the operations of the circuits in the core/peripheral circuit region 200, a wafer open control dummy pattern 212 inclining at substantially the same direction and/or at the same angle as the patterns of the cell region 100 is formed in the secondary region 210. The angle difference between the two patterns is no more than 15 degrees, or 10 degrees, or 5 degrees, or 3 degrees, or 1 degree according to implementation. In the present embodiment, these two patterns also incline in the same direction, but this may not be the case in another embodiment.

Figure 4:
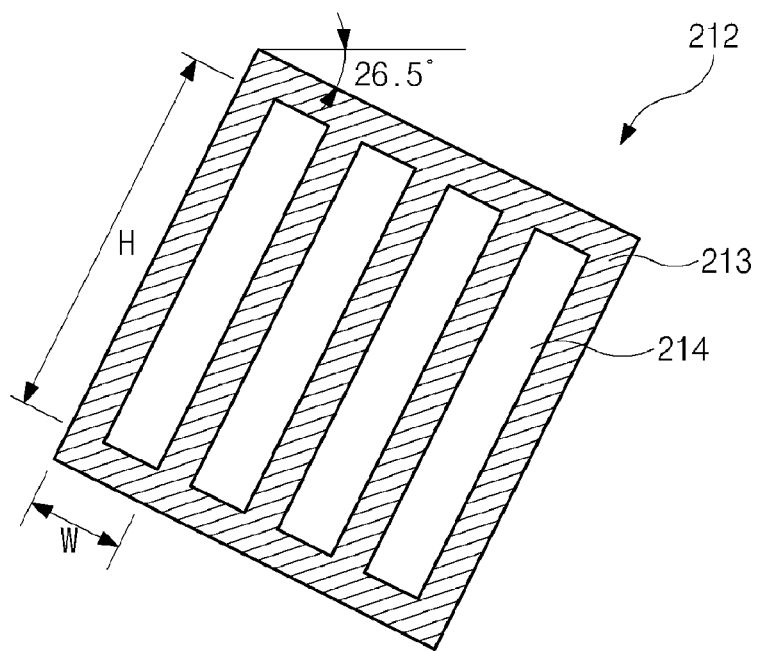
FIG. 4 is a detailed diagram illustrating a wafer open control dummy pattern of FIG. 3.

FIG. 4 is a detailed diagram illustrating the wafer open control dummy pattern of FIG. 3.

The wafer open control dummy pattern 212 includes one or more rectangular open regions 214 (in this embodiment, four rectangular open regions). The open regions 214 are formed at regular intervals within a rectangular pattern 213 inclined a predetermined angle, and they are inclined at substantially the same angle as the rectangular pattern 213.

In this case, a height-to-width ratio of the open region 214 may be approximately 5:1, and line patterns surrounding the open region 214 may be formed to have the same critical dimension (CD). As illustrated in FIG. 4, the wafer open control dummy pattern 212 may be inclined at substantially the same angle as the ISO pattern of the cell region 100. For example, the wafer open control dummy pattern 212 may be formed to be rotated at approximately 26.5 degrees with respect to the length direction of a bit line, or approximately 116.5 degrees with respect to the length direction of a word line. However, the above case is merely based on the semiconductor device having a 6F² layout, and the inclined direction and angle of the wafer open control dummy pattern 212 may be changed according to design modification of the semiconductor device. Moreover, it is preferable that the pattern 213 and the open region 214 have a rectangular shape as illustrated in FIG. 4, but they are not limited thereto.

Figure 5:
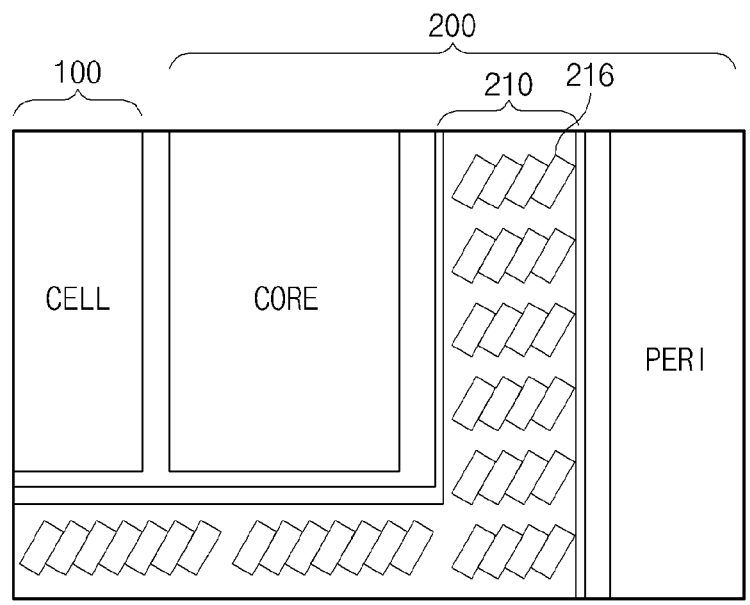
FIG. 5 is a plan view illustrating a layout of a semiconductor device having a CMP dummy pattern according to another embodiment of the present invention.
Figure 6:
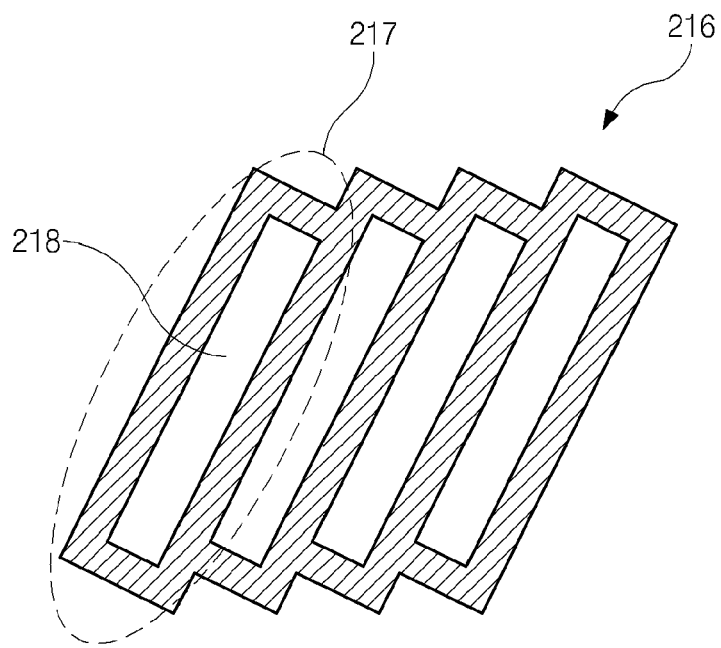
FIG. 6 is a detailed diagram illustrating a wafer open control dummy pattern of FIG. 5.

FIG. 5 is a plan view illustrating a layout of a semiconductor device having a wafer open control dummy pattern (or CMP dummy pattern) 216 according to another embodiment of the present invention, and FIG. 6 is a detailed diagram of the dummy pattern of FIG. 5.

As illustrated in FIG. 6, the wafer open control dummy pattern 216 includes a plurality of box-type unit patterns 217 (hereinafter, referred to as box patterns), each of which has a rectangular open region 218 inclined at a predetermined angle.

In the same manner as in FIG. 4, the open region 218 inside the box pattern 217 may be formed to have a height-to-width ratio of approximately 5:1.

Figure 7:
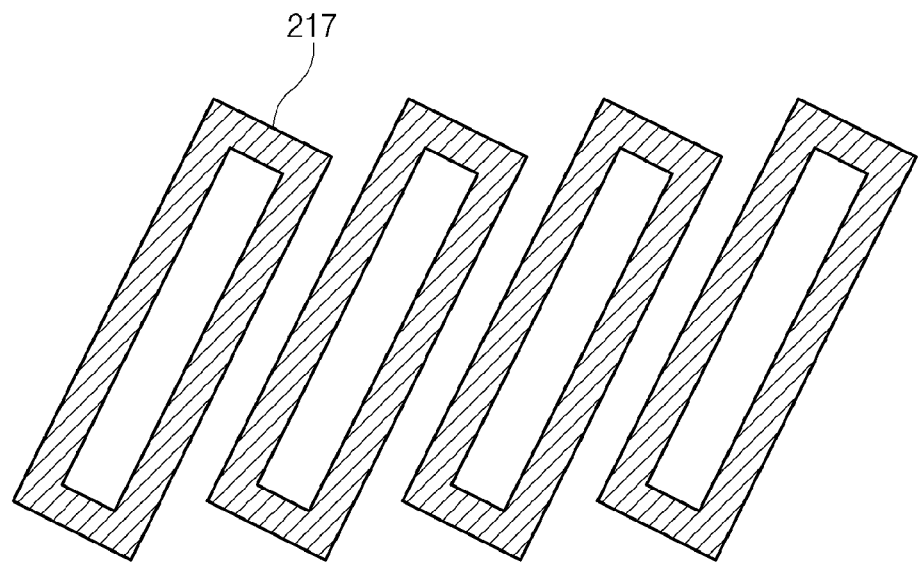
FIG. 7 is a diagram illustrating the wafer open control dumpy pattern of FIG. 6 which is separated on the basis of a box pattern.

Although FIG. 6 shows that a predetermined number of box patterns 218 are integrally formed by sharing their side surfaces with line patterns, the box patterns 217 may also be formed independently and separated from each other, as illustrated in FIG. 7. Such a pattern shape corresponds to a case where only one open region 214 is formed within the wafer open control dummy pattern 212 of FIG. 4.

A method for manufacturing the pattern of the semiconductor device having the above-mentioned structure will be described below. In the following description, an ISO pattern will be used as an example. The present invention is not limited to the use in connection with the isolation pattern, as will be understood by those skilled in art.

A pad oxide film (not shown) is formed over a substrate defining a cell region 100 and a core/peripheral circuit region 200 in order for suppression of crystal defects of the substrate and surface treatment. The pad oxide film is formed using a dry or wet oxidation process and is formed to a thickness of approximately 70 Å to 100 Å in a temperature range of approximately 750° C. to approximately 900° C.

A pad nitride film (not shown) is formed over the pad oxide film. The pad nitride film may be deposited using a low pressure chemical vapor deposition (LPCVD) process. The pad nitride film is deposited to a thickness sufficient to secure for formation of a device isolation structure. The pad nitride film may be deposited to a thickness of approximately 2,500 Å to approximately 3,500 Å.

A shallow trench isolation (STI) etch process is performed to form a trench within the substrate. The STI etch process includes a mask process and an etch process. Specifically, a photoresist film is coated over the pad nitride film, and an exposure/development process using a photo mask is performed to form a photoresist pattern. The substrate is etched by an etch process using the photoresist pattern as an etch mask. Through such an STI etch process, a wafer open control dummy pattern 212 or 216 arranged obliquely at a predetermined angle is formed in a secondary region 210 of a circuit region 200 in order to prevent non-uniform warpage of the wafer in a subsequent CMP process of forming a device isolation structure. The wafer open control dummy pattern 212 or 216 is formed to have the same direction and/or the same angle as an ISO pattern of the cell region 100.

An insulating film for device isolation is deposited to fill the trench, and a CMP process is performed to form a device isolation film. The device isolation film may include a high density plasma (HDP) oxide film having an excellent gap-filling characteristic which can prevent the formation of voids within the trench.

Figure 8:
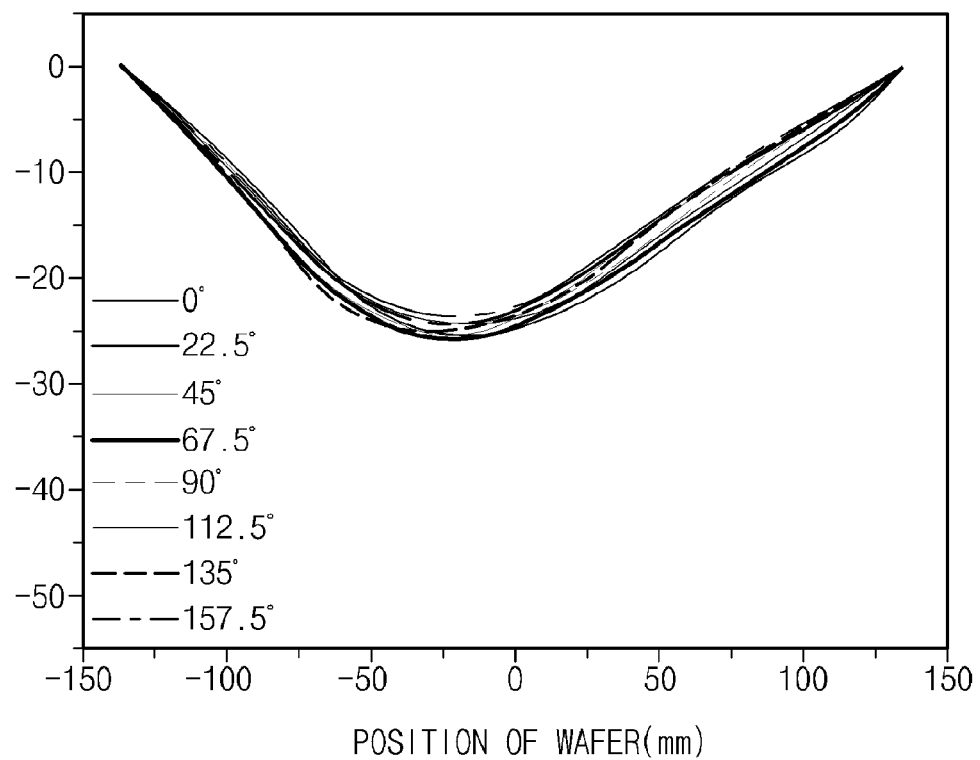
FIG. 8 is a graph showing the measurement of warpage according to a position of a wafer after an ISO process when a dummy pattern of the present embodiment is used.

FIG. 8 is a graph showing the measurement result of warpage according to a position of the wafer after the ISO process when the dummy pattern of the present invention is used.

As can be seen from FIG. 8, the warpage according to the position of the wafer was remarkably improved when the wafer open control dummy pattern is used as the CMP dummy pattern inserted into the circuit region 200 was formed not in the vertical direction but in the same direction as the pattern of the cell region 100.

According to the embodiments of the present invention, the warpage of the wafer can be prevented by forming the CMP dummy pattern in the same direction and/or at the same angle as the pattern of the cell region. As a result, overlay error caused by etching residues is reduced, thereby improving the yield of the semiconductor device.

The above embodiments of the present invention are illustrative and not limitative, e.g., the invention is not limited to the isolation formation process and the isolation patterns. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a cell region including a first pattern; and
   a circuit region including a second pattern with a lower density than the cell region, and a dummy pattern arranged in substantially the same direction as the first pattern,
   wherein the dummy pattern includes at least one open region inclined at the same angle as the first pattern within a pattern inclined at substantially the same angle as the open region.

2. The semiconductor device according to claim 1, wherein the dummy pattern includes a chemical mechanical polishing (CMP) dummy pattern arranged in a wafer open control dummy region.

3. The semiconductor device according to claim 1, wherein the pattern inclined at substantially the same angle as the open region is a rectangular pattern.

4. The semiconductor device according to claim 3, wherein the open region has a height-to-width ratio of approximately 5:1.

5. The semiconductor device according to claim 1, wherein the dummy pattern includes a plurality of unit patterns that are integrally formed.

6. The semiconductor device according to claim 5, wherein an open region defined by the unit pattern has a height-to-width ratio of approximately 5:1.

7. The semiconductor device according to claim 1, wherein the first pattern and the second pattern include an ISO pattern.

8. The semiconductor device according to claim 1, wherein the dummy pattern is inclined at the same angle as the first pattern.

9. The semiconductor device according to claim 1, wherein the first pattern is arranged oblique to a word line.

10. A semiconductor device comprising:
    a cell region including a first pattern; and
    a circuit region including a second pattern with a lower density than the cell region, and a dummy pattern arranged at the same angle as the first pattern,
    wherein the at least one open region is disposed at the same angle as the first pattern within a pattern inclined at the same angle as the open region.

11. The semiconductor device according to claim 10, wherein the pattern inclined at substantially the same angle as the open region is a rectangular pattern.

12. The semiconductor device according to claim 11, wherein the open region has a height-to-width ratio of approximately 5:1.

13. The semiconductor device according to claim 10, wherein the dummy pattern includes a plurality of unit patterns that are integrally formed with each other.

14. The semiconductor device according to claim 13, wherein an open region defined by the unit pattern has a height-to-width ratio of approximately 5:1.

15. The semiconductor device according to claim 10, wherein the first pattern is arranged to be crossed diagonally with a word line.

* * * * *